(12) United States Patent
Montoye et al.

(10) Patent No.: US 11,095,313 B2
(45) Date of Patent: Aug. 17, 2021

(54) EMPLOYING SINGLE ERROR CORRECTION AND TRIPLE ERROR DETECTION TO OPTIMIZE BANDWIDTH AND RESILIENCE UNDER MULTIPLE BIT FAILURES

(71) Applicant: INTERNATIONAL BUSINESS MACHINES CORPORATION, Armonk, NY (US)

(72) Inventors: Robert Montoye, New York, NY (US); Jeffrey Derby, Chapel Hill, NC (US); Bruce Fleischer, Bedford Hills, NY (US); Prashant Jayaprakash Nair, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

(21) Appl. No.: 16/659,241

(22) Filed: Oct. 21, 2019

(65) Prior Publication Data
US 2021/0119646 A1    Apr. 22, 2021

(51) Int. Cl.
| | | |
|---|---|---|
| *H03M 13/00* | (2006.01) | |
| *H03M 13/29* | (2006.01) | |
| *G06F 11/07* | (2006.01) | |
| *H03M 13/09* | (2006.01) | |
| *H03M 13/19* | (2006.01) | |

(52) U.S. Cl.
CPC ..... *H03M 13/2906* (2013.01); *G06F 11/0772* (2013.01); *H03M 13/095* (2013.01); *H03M 13/19* (2013.01)

(58) Field of Classification Search
None
See application file for complete search history.

(56) References Cited

U.S. PATENT DOCUMENTS

| | | | |
|---|---|---|---|
| 5,359,557 A * | 10/1994 | Aipperspach | G11C 29/74 365/189.02 |
| 8,069,395 B2 | 11/2011 | Deierling et al. | |
| 8,694,872 B2 | 4/2014 | Goel | |
| 9,071,273 B2 | 6/2015 | Resnick | |
| 9,104,542 B2 * | 8/2015 | Szapiro | G06F 11/1064 |
| 9,703,629 B2 * | 7/2017 | Desireddi | G06F 11/1068 |

(Continued)

OTHER PUBLICATIONS

A. Ramos, A. Ullah, P. Reviriego and J. A. Maestro, "Efficient Protection of the Register File in Soft-Processors Implemented on Xilinx FPGAs," in IEEE Transactions on Computers, vol. 67, No. 2, pp. 299-304, Feb. 1, 2018, doi: 10.1109/TC.2017.2737996. (Year :2017).*

(Continued)

*Primary Examiner* — Daniel F. McMahon
(74) *Attorney, Agent, or Firm* — Griffiths & Seaton PLLC

(57) ABSTRACT

Single error correction ("SEC") code and triple error detection ("TED") code are used to optimize bandwidth and resilience under multiple bit failures. One or more errors in data stored in duplicated registers are detected and corrected using the SEC code and TED code where simultaneous read operations are produced with two copies of data for each of the duplicated registers for a multi-port banked memory array. The SEC code and TED code may be included in each of the two data copies of the simultaneous read operations.

15 Claims, 15 Drawing Sheets

(56) References Cited

U.S. PATENT DOCUMENTS

| | | | |
|---|---|---|---|
| 9,787,329 B2 | 10/2017 | Ish-Shalom et al. | |
| 2005/0005069 A1* | 1/2005 | Au | G11C 7/106 |
| | | | 711/131 |
| 2005/0149834 A1* | 7/2005 | Chen | H03M 13/05 |
| | | | 714/781 |
| 2013/0111303 A1 | 5/2013 | Avudaiyappan et al. | |
| 2013/0227374 A1 | 8/2013 | Desireddi | |
| 2013/0262957 A1 | 10/2013 | Wu et al. | |
| 2017/0337015 A1* | 11/2017 | Choi | G06F 3/0659 |
| 2018/0019767 A1 | 1/2018 | Jung et al. | |
| 2018/0203761 A1 | 7/2018 | Halbert et al. | |

OTHER PUBLICATIONS

"Parallel Double Error Correcting Code Design to Mitigate Multi-Bit Upsets in SRAMs", Naseer et al., (4 Pages).

"Multiple Upset Tolerant Memory Using Modified Hamming Code", Antony et al., IOSR Journal of Electronics and Communication Engineering (IOSR-JECE) e-ISSN: 2278-2834, p- ISSN: 2278-8735 pp. 31-39, (9 Pages).

"Design of Single Error Correction-Double Adjacent Error Detection-Triple Adjacent Error Detection-Tetra Adjacent Error Detection (Sec-Daed-Taed-Tetra Aed) Codes", Manikandan et al., International Journal of Applied Engineering Research ISSN 0973-4562 vol. 11, No. 6 (2016) pp. 4440-4444, Research India Publications, (5 Pages).

"Implementing Triple Adjacent Error Correction in Double Error Correction Orthogonal Latin Squares Codes", Reviriego et al., 2013 IEEE International Symposium on Defect and Fault Tolerance in VLSI and Nanotechnology Systems (DFTS), (5 Pages).

\* cited by examiner

EMPLOYING SINGLE ERROR CORRECTION AND TRIPLE ERROR DETECTION TO OPTIMIZE BANDWIDTH AND RESILIENCE UNDER MULTIPLE BIT FAILURES

STATEMENT REGARDING FEDERALLY SPONSORED RESEARCH OR DEVELOPMENT

This invention was made with Government support under Contract No.: HR0011-13-C-0022 awarded by Defense Advanced Research Projects Agency (DARPA). The Government has certain rights in this invention.

BACKGROUND OF THE INVENTION

Field of the Invention

The present invention relates in general to computing systems, and more particularly to, various embodiments for employing single error correction ("SEC code") and triple error detection ("TED code") to optimize bandwidth and resilience under multiple bit failures using one or more computing processors.

Description of the Related Art

In today's society, computer systems are commonplace. Computer systems may be found in the workplace, at home, or at school. Computer systems may include data storage systems, or disk storage systems, to process and store data. In recent years, both software and hardware technologies have experienced amazing advancement. Processing devices, with the advent and further miniaturization of integrated circuits, have made it possible to be integrated into a wide variety of devices. In recent years, both software and hardware technologies have experienced amazing advancement. With the new technology, more and more functions are added, and greater convenience is provided for use with these computing systems.

SUMMARY OF THE INVENTION

Various embodiments for provided for enhanced error correction using single error correction ("SEC") code and triple error detection ("TED") code to optimize bandwidth and resilience under multiple bit failures in a computing system by a processor are provided. One or more errors may be detected and corrected in duplicated registers using an SEC code and TED code where simultaneous read operations are produced with two copies of data for each of the duplicated registers for a multi-port banked memory array. The SEC code and TED code may be included in each of the two data copies of the simultaneous read operations.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
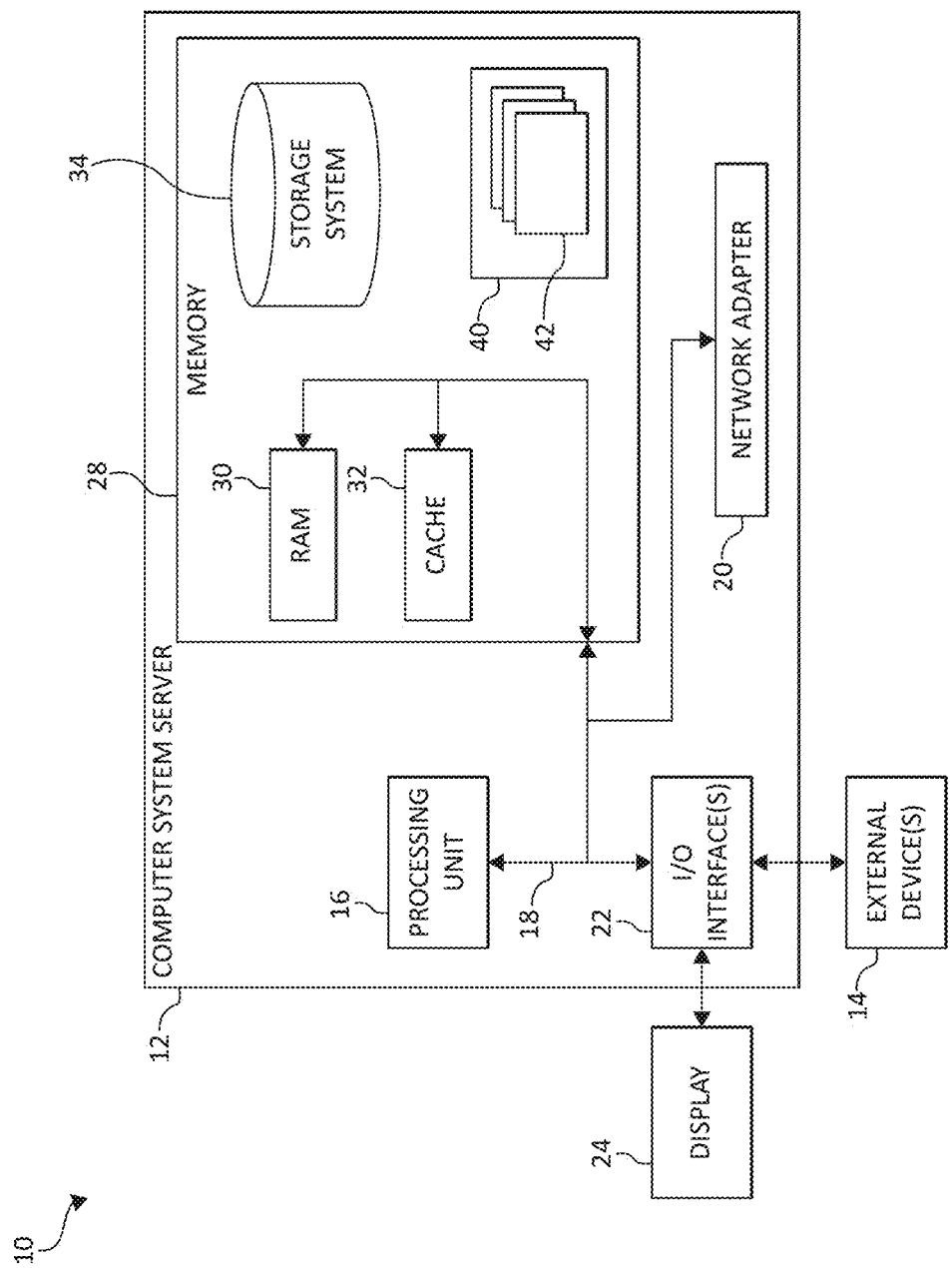
FIG. 1 is a block diagram depicting an exemplary cloud computing node according to an embodiment of the present invention.

As a preliminary matter, electronic circuits have significant data storage capacities. Such capacities may be achieved with large memories formed of several memory blocks for physical or logical reasons. For example, such memories may include SRAM (Static Random-Access Memory) or DRAM (Dynamic Access Memory). A memory controller enables the other functions of the electronic circuit to view all the memory blocks as a single memory, in terms of address.

A multiple port memory comprises a plurality of ports. Such memory can be a RAM or SRAM. Multiple-port ("Multiport") memories (e.g., Multi-port RAMs) have been developed for high speed applications, such as real time signal processing or parallel data processing. Generally, each port represents an independent input and/or output path for writing data into the memory. A multiple port memory may, for example, comprise several write ports and read ports but the number of write ports need not to be the same as the number of read ports. A multiple-port memory may provide dual ports that provide the ability for independent read and write access paths to the memory. For example, the multiple-port memory may write data to the memory and/or read data from the memory on a first port while simultaneously writing alternative data to the memory on a second port and/or read alternative data from the memory on the second port.

However, memory systems may be susceptible to memory device failures and errors, where the error may be categorized as either a soft error or a hard error. A soft error may be a temporary error which is fixed as soon as new data is written into the affected storage location. Said differently, a soft error may be defined as an error occurrence in a memory system that changes an instruction in an application/software program or data value. A hard error may refer to those errors in which data can no longer reliably be stored at a given memory location. A hard error may be caused by a failure of a memory hardware device (e.g., chip). Either of these types of errors can lead to catastrophic failure of the memory subsystem.

Thus, the use of error correction code ("ECC") in computing systems is becoming more and more prevalent in computers as the size of memory and its sensitivity to errors increases. Error correction is accomplished, for example, by using an error correction code which generates check bits from the data written to memory and stores the check bits together with the data bits in memory. When the data bits and check bits are read from memory a new set of check bits is generated from the stored data bits and a comparison is made between the newly generated check bits and the stored check bits.

In one aspect, hardware diagnostic tests for memory arrays or buses rely on hardware-generated ECCs, which detect and correct single-bit errors known as correctable errors ("CEs"). Such ECCs are often further enabled to detect, but not correct, multi-bit errors known as uncorrectable errors ("UEs"). As utilized herein, a "correctable error" may refer to an error that may be corrected by the ECC logic itself. Such correctable errors are defined in part as comprising "n" or less bits, wherein "n" is the ECC logic design specified upper limit on the maximum number of error bits that can be corrected for a given detected error. For example, a single error correction ECC defines correctable errors as single bit errors to the exclusion of all multiple bit errors. An uncorrectable error ("UE") may refer generally to errors that may be detected but not corrected in accordance with conventional ECC logic convention. UEs may further refer to multi-bit errors detected across multiple ECC logic test runs.

In one aspect, computing systems may include registers associated with the multiple-port memory. The registers may, for example, provided a controlled delay in communication with the multiple-port memory. In one aspect, a computing system may require multiple and simultaneous read operations (e.g., four simultaneous reads) that many computing systems require using the basic element of 1R1W (e.g., SRAM number of ports may be referred to as "xRyW" such as, for example, 1R1W refers to an SRAM with 1 read and 1 write port). For example, a multiple-port memory may be a two-port memory, such as a single-port read, single-port write ("1R1W") memory, which has a read port and a write port. Thus, an eight transistor (8T)-SRAM cell may operate at twice the processor cycle requires at least 2 data copies of each register with 2 reads available per cycle per copy, as illustrated below in FIG. 4. Due to the increased potential of experiencing an error in the multiple-port memory, a need exists to enhance each data copy by adding single error correct (SEC code) code and triple error detect (TED code) code to correct any three errors in duplicated registers while retaining full performance for a multiple-port memory in error free systems.

Accordingly, the present invention provides a solution to enhance error correction using single error correction ("SEC") code and triple error detection ("TED") code to optimize bandwidth and resilience under multiple bit failures in a computing system. One or more errors may be detected and corrected in duplicated registers using an SEC code and TED code where simultaneous read operations are produced with two copies of data for each of the duplicated registers for a multi-port banked memory array. The SEC code and TED code may be included in each of the two data copies of the simultaneous read operations.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
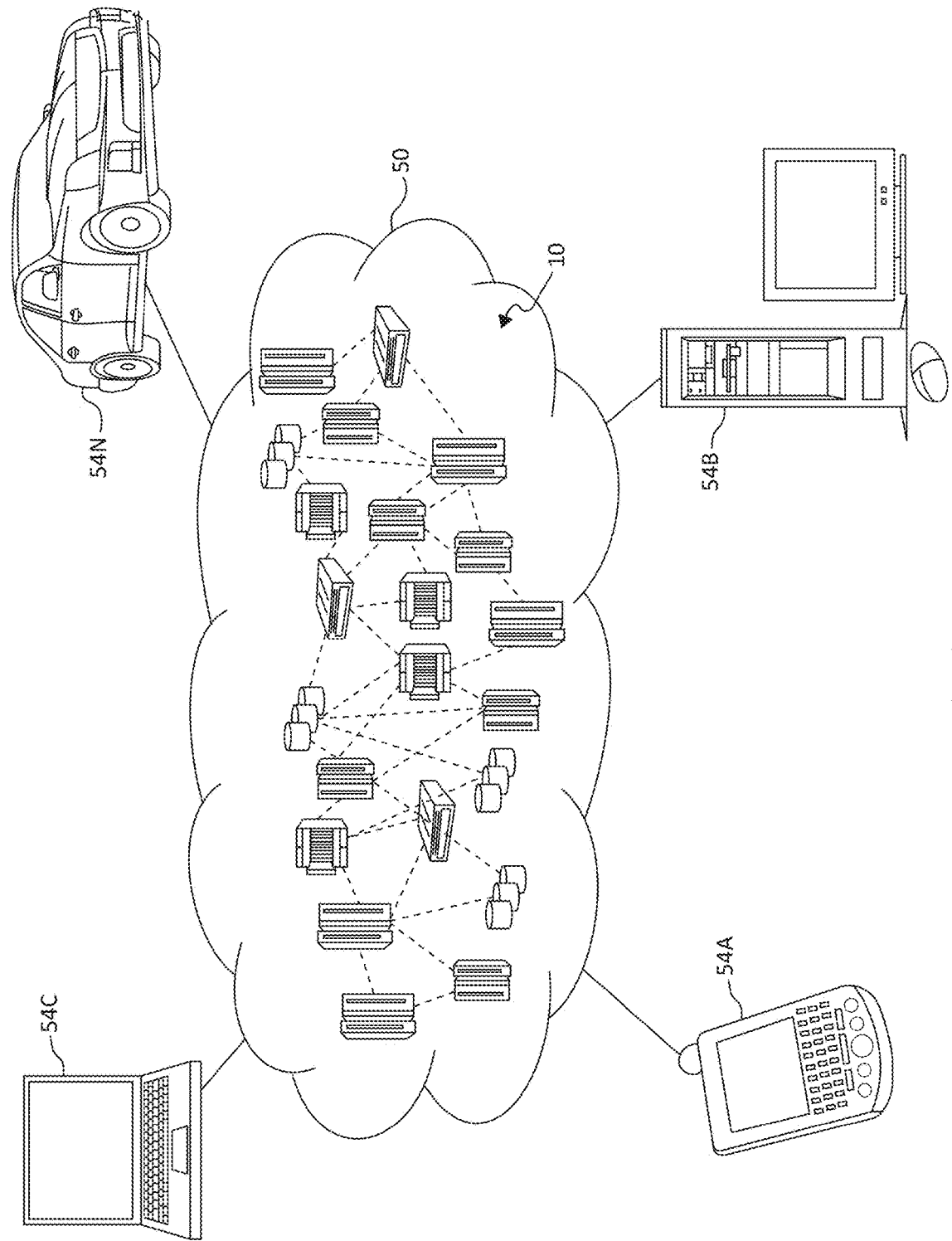
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
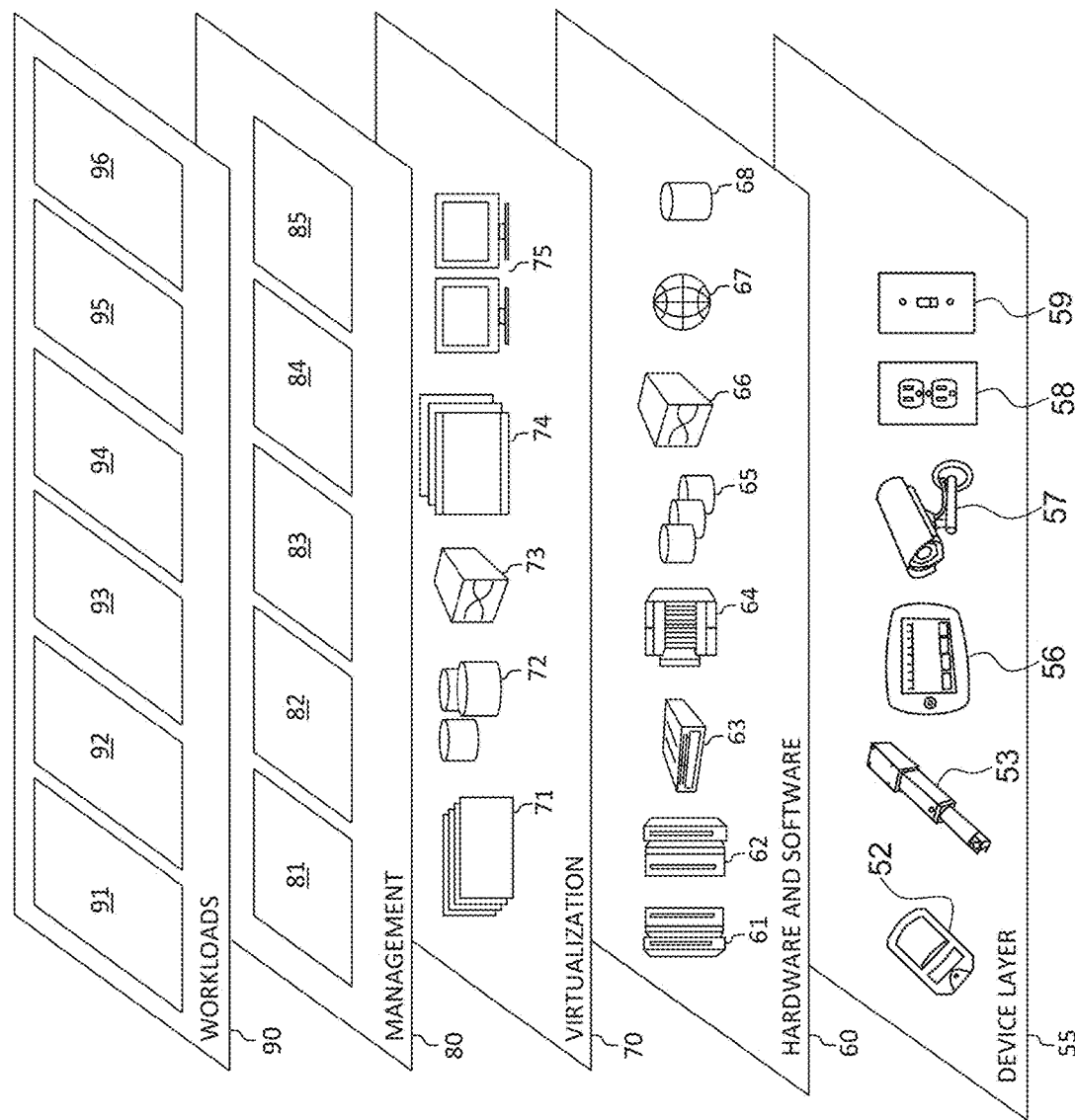
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 for employing SEC code and TED code in a multiport memory system in a computing environment. In addition, workloads and functions 96 for SEC code and TED code in a multiport memory system in a computing environment may include such operations as data analysis (including data collection and processing from various environmental sensors) and/or analytics operations. One of ordinary skill in the art will appreciate that the workloads and functions 96 for SEC code and TED code in a multiport memory system in a computing environment may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

As previously mentioned, the mechanisms of the illustrated embodiments provide novel approaches for using an SEC code and a TED code to optimize bandwidth and resilience under multiple bit failures in a computing environment.

Figure 4:
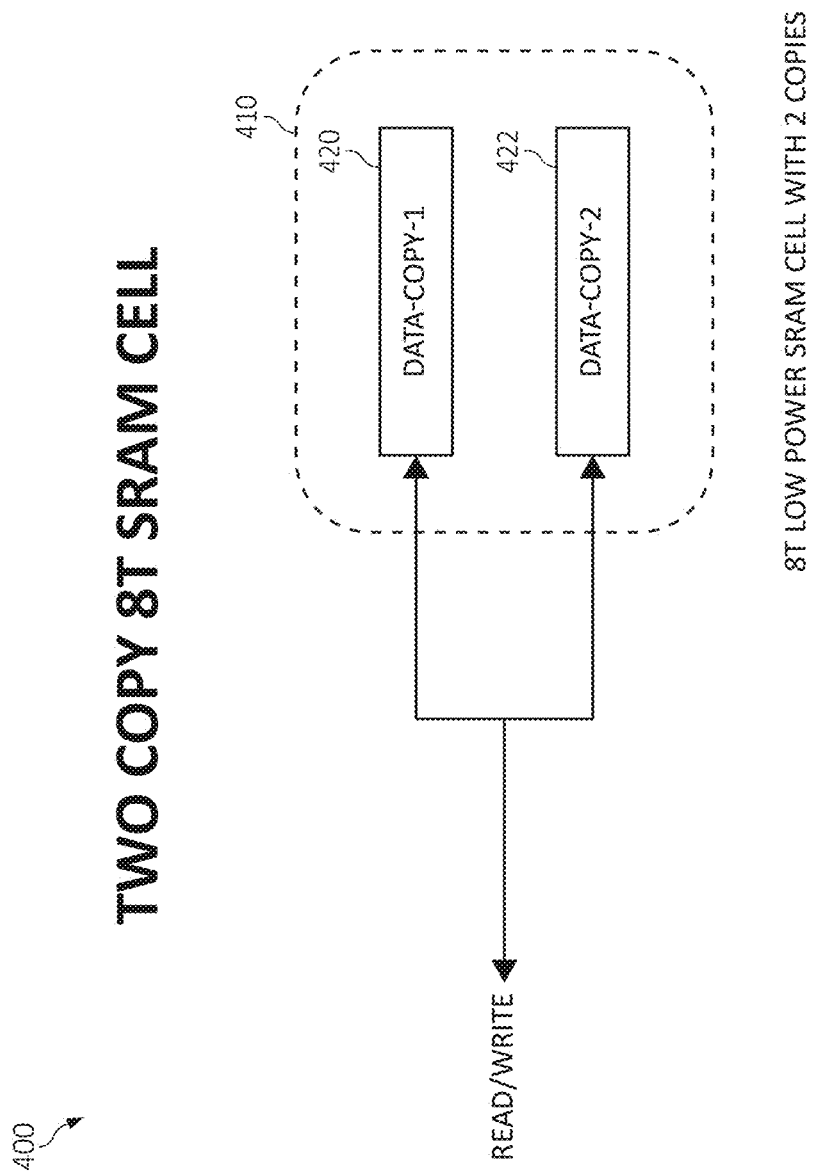
FIG. 4 is an additional block diagram depicting a multi-port banked memory array in which aspects of the present invention may be realized.

Turning now to FIG. 4, diagram 400 depicts an 8T-SRAM cell 410 (e.g., an 8T SRAM Cell with two data copies). In one aspect, one or more of the components, modules, services, applications, and/or functions described in FIGS. 1-3 may be used in FIG. 4. For example, the 8T-SRAM cell 410 may be components internal and/or external to a multiport memory system that may be incorporated and/or included in a computer system/server 12 of FIG. 1. In one aspect, the 8T-SRAM cell 410 may include, for example, at least two data copies 420 and 422 (e.g., data-copy-1 and data-copy-2) in the 8T-SRAM cell 410 for read and/or write operations. The 8T-SRAM cell 410 may operate at twice the processor cycle given the requirement of at least 2 data copies 420 and 422 of each register with 2 reads available per cycle per copy.

Thus, to enhance error correction such as, for example, in an 8T-SRAM cell as in FIG. 4, the present invention may employ a SEC code and a TED code to optimize bandwidth and resilience under multiple bit failures, as illustrated below in diagrams 500, 515, 525, 535, 545, 555, 565, 575, and 585 of FIGS. 5A-5I. In one aspect, repetitive description of like elements, components, modules, services, applications, and/or functions employed in other embodiments described herein (e.g., FIGS. 1-4 and FIGS. 5A-5I) is omitted for sake of brevity.

Figure 5A:
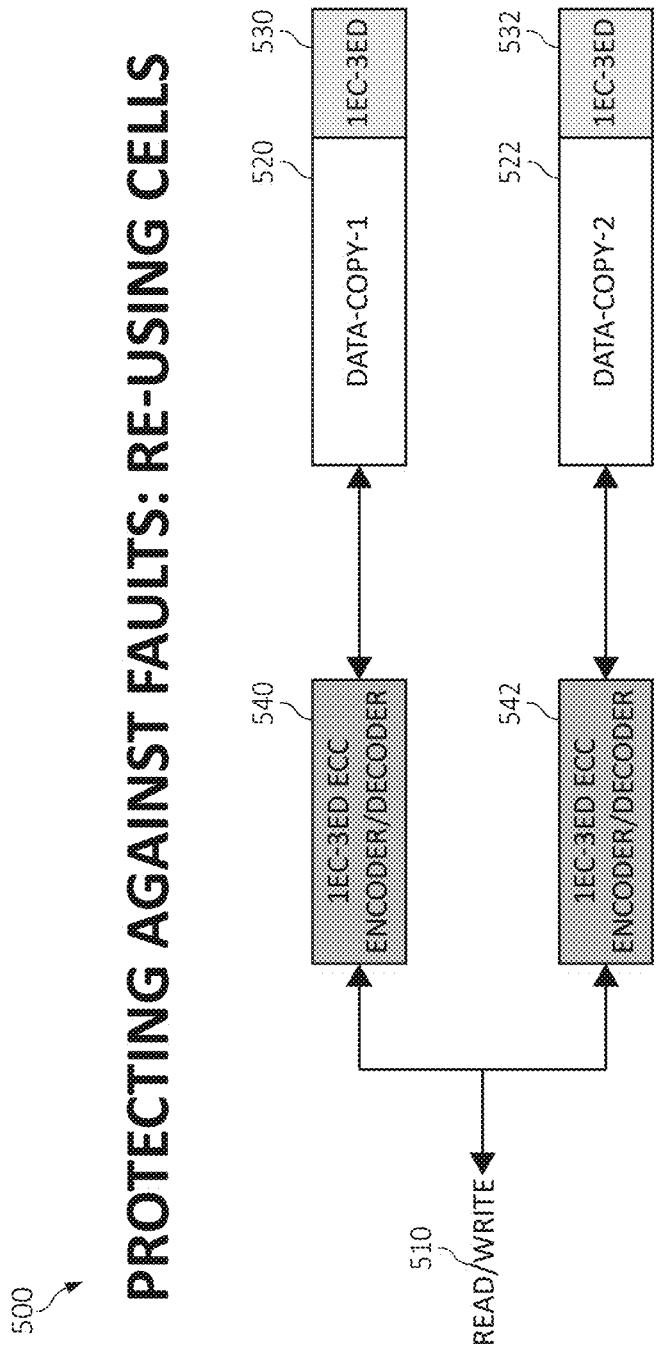
FIG. 5A is an additional block diagram depicting protecting against data faults by re-using data copies in a multiport banked memory array in which aspects of the present invention may be realized.

To further illustrate the mechanisms of the illustrated embodiments, consider the following operations as described in FIGS. 5A-5I. As a preliminary matter, consider diagram 500 of FIG. 5A depicting the operations of protecting against data faults by re-using data copies 520, 522 in a multiport memory (e.g., an 8T-SRAM cell). That is, each of the data copies 520, 522 (e.g., data-copy-1 and data-copy-2) include an SEC code and a TED code 530 (e.g., 1EC-3D) and SEC code and a TED code 532 (e.g., 1EC-3D). In operation, upon receiving a read/write operation 510, an encoder/decoder 540 (e.g., a single ("1") error code ("EC" or "SEC") and triple ("3") error detector encoder/decoder 540 and 542 may be employed to protect against errors or faults by reusing one or more of the 8T-SRAM cells (e.g., reusing the data copies 520, 522).

With the ability to correct a single error offered by SEC, the present invention may use the presence of duplicate registers to detect and correct up to three errors in the aggregate of both register as described in FIG. 5B-5I.

Figure 5B:
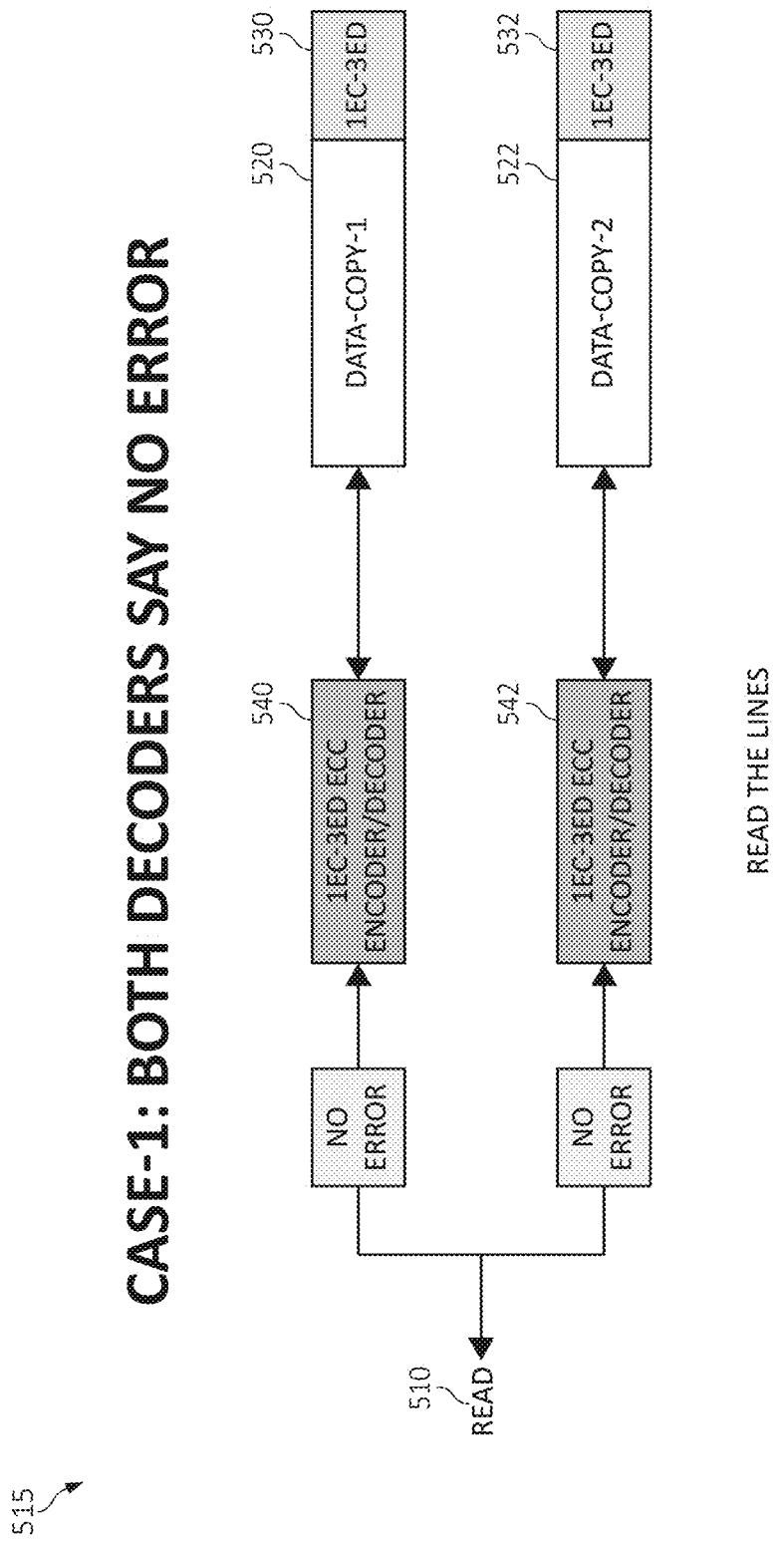
FIG. 5B is an additional block diagram depicting detection of no data faults using SEC code and TED code in a multiport banked memory array in which aspects of the present invention may be realized.

As depicted in FIG. 5B, a read operation may be performed on one or more selected ports (e.g., reading a line) to determine if one or more the encoder/decoder 540 or 542 depicts an error. If there is "no error" detected by the encoder/decoder 540 or 542, the data copy 520 and/or data copy 522 may be used (depending on which line is read).

Figure 5C:
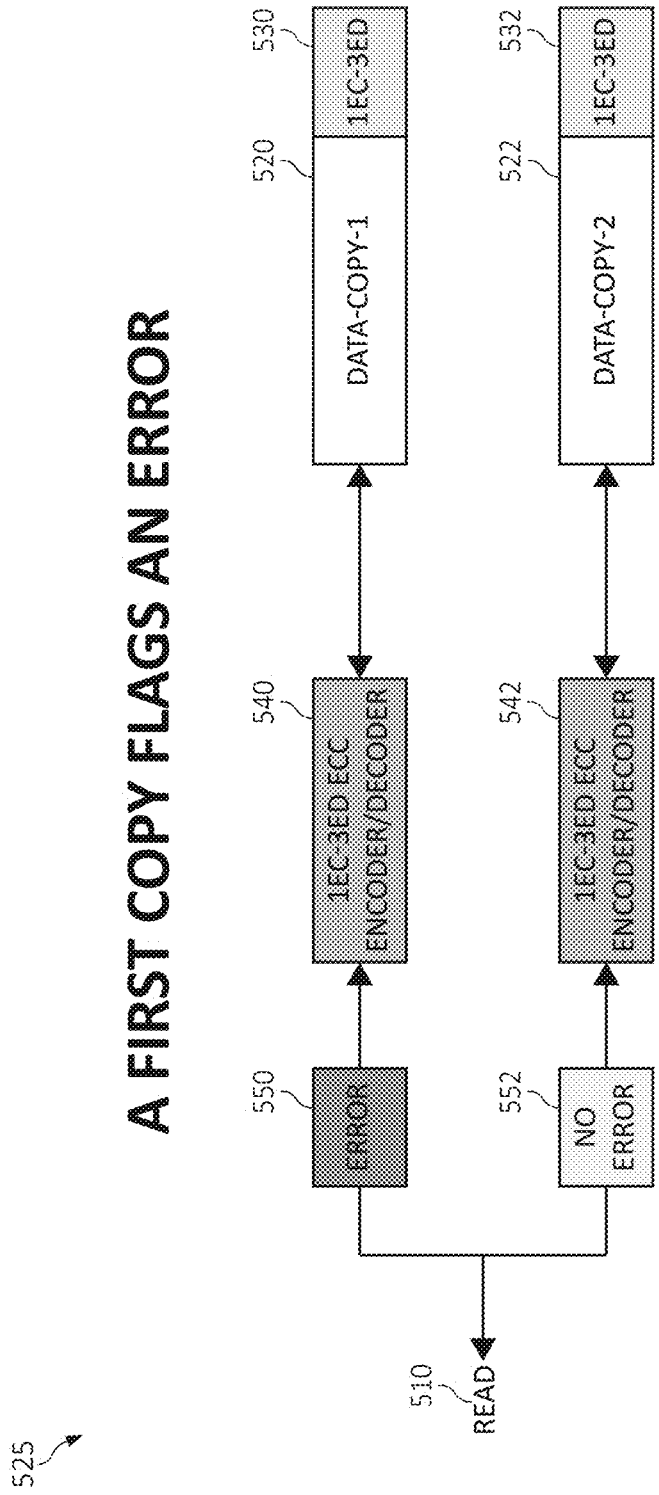
FIG. 5C is an additional block diagram depicting an error in a first data copy by SEC code and TED code and no errors in a second data copy in a multiport banked memory array in which aspects of the present invention may be realized.

However, if the encoder/decoder 540 or 542 depicts an error 550 such as, for example, the error 550 for data copy 520 (e.g., a first copy of data), the data copy 522 may be used (depending on which line is read an assuming no error is detected as in block 552)) and the erroneous line of data copy 520 (e.g., the first copy of data) may be updated/corrected, as in FIG. 5C. Also, a flag/alert may be issued indicating an error (e.g., error 550 for data copy 520) has occurred.

Figure 5D:
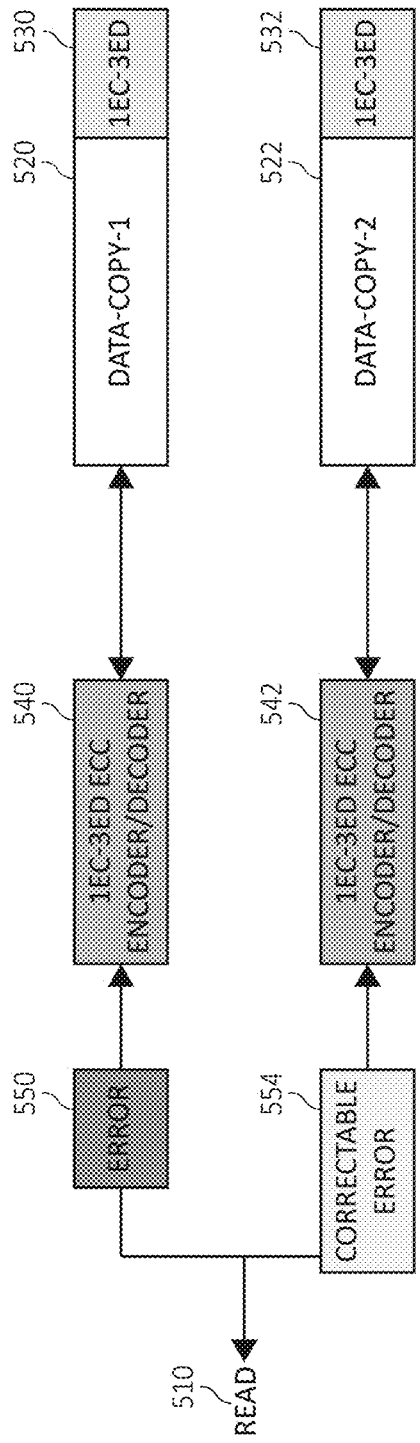
FIG. 5D is an additional block diagram depicting an error in a first data copy by SEC code and TED code and a correctable error in a second data copy in a multiport banked memory array in which aspects of the present invention may be realized.

In the event that the encoder/decoder 540 detects the error 550 in data copy 520 and also the encoder/decoder 542 detects an error 554 for the data copy 522, but the error 554 is a "correctable error", the corrected value of the data copy 522 may still be used and the erroneous line of data copy 520 (e.g., first copy of data) may be updated/corrected, as in FIG. 5D. Also, a flag/alert may be issued indicating an error has occurred.

Figure 5E:
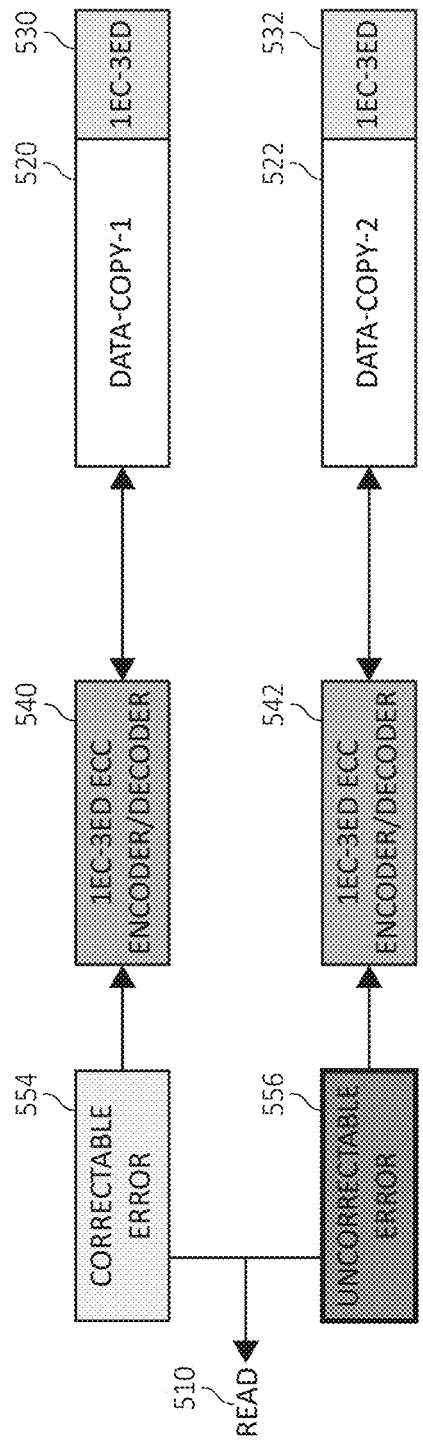
FIG. 5E is an additional block diagram depicting a correctable error in a first data copy by SEC code and TED code and an uncorrectable error in a second data copy in a multiport banked memory array in which aspects of the present invention may be realized.

Alternatively, if the encoder/decoder 540 detects the error 554 is a "correctable error") in data copy 520 and the encoder/decoder 542 detects an uncorrectable error 556 in the data copy 522, the corrected value of the data copy 520 (of the first copy of data "data-copy-1") of an original read operation may still be used, as in block FIG. 5E. Also, a flag/alert may be issued indicating an uncorrectable error has occurred.

Figure 5F:
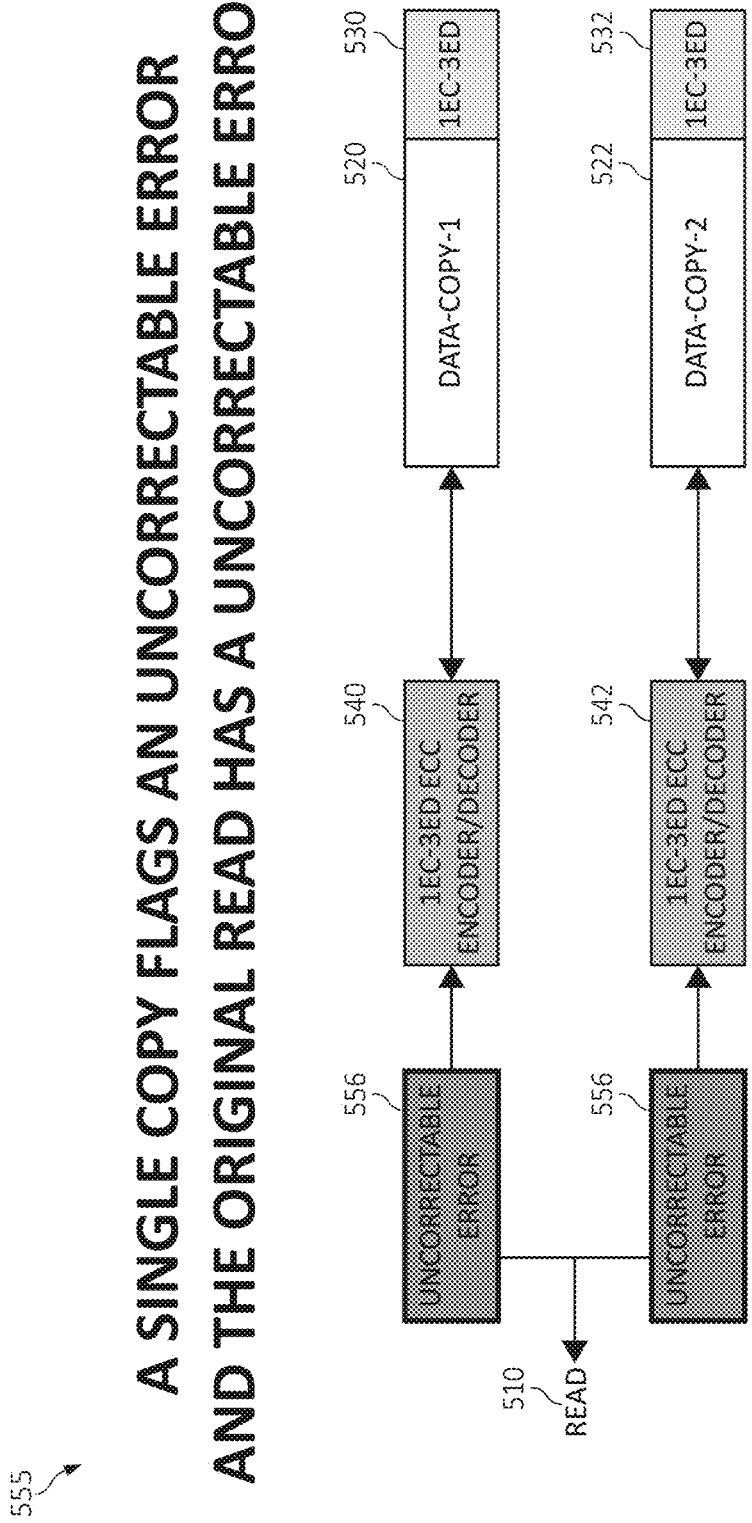
FIG. 5F is an additional block diagram depicting an uncorrectable error in a first data copy by SEC code and TED code and an uncorrectable error in a second data copy in a multiport banked memory array in which aspects of the present invention may be realized.

Turning now to FIG. 5F, in the event that the encoder/decoder 540 detects a uncorrectable error 556 in the data copy 520 and the encoder/decoder 542 detects an uncorrectable error 556 in the data copy 522, a computing system may issue an alert/warning indicating both the data copy 520 and the data copy 520 have detectable uncorrectable errors ("DUE").

Figure 5G:
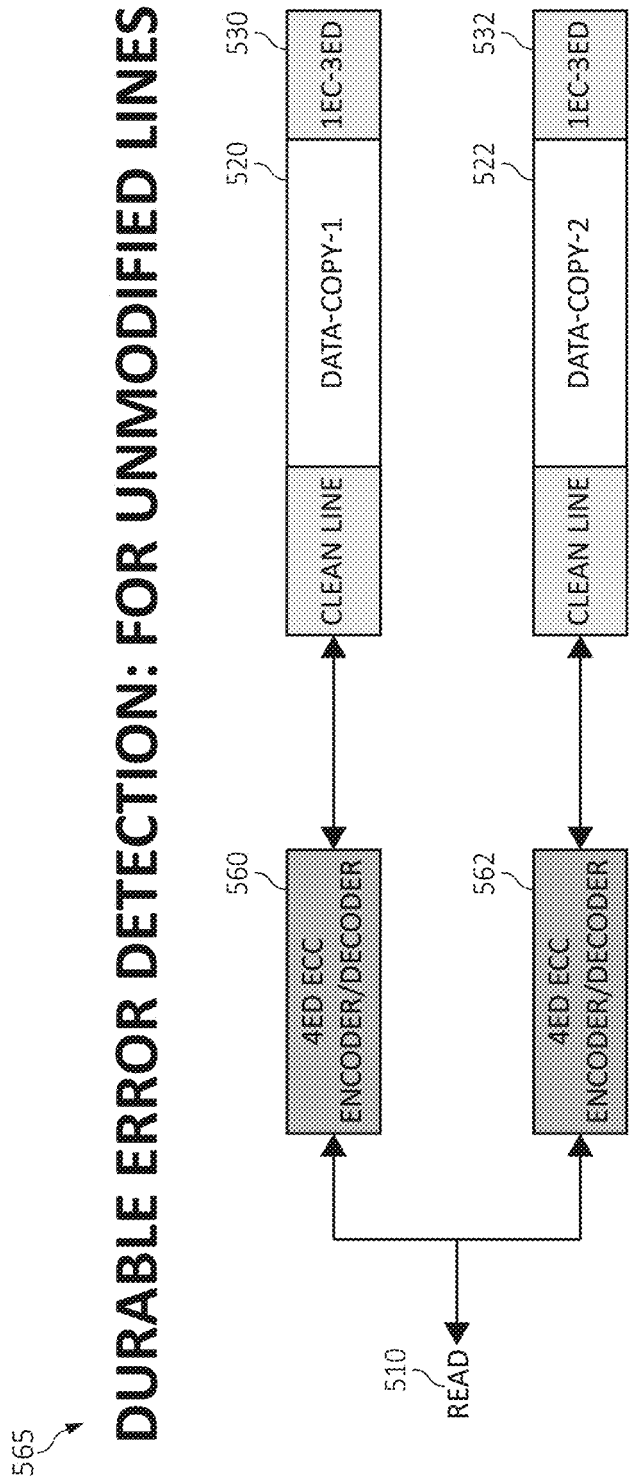
FIG. 5G-I is an additional block diagram depicting durable error correction for unmodified lines using SEC code and TED code in a multiport banked memory array in which aspects of the present invention may be realized.
Figure 5H:
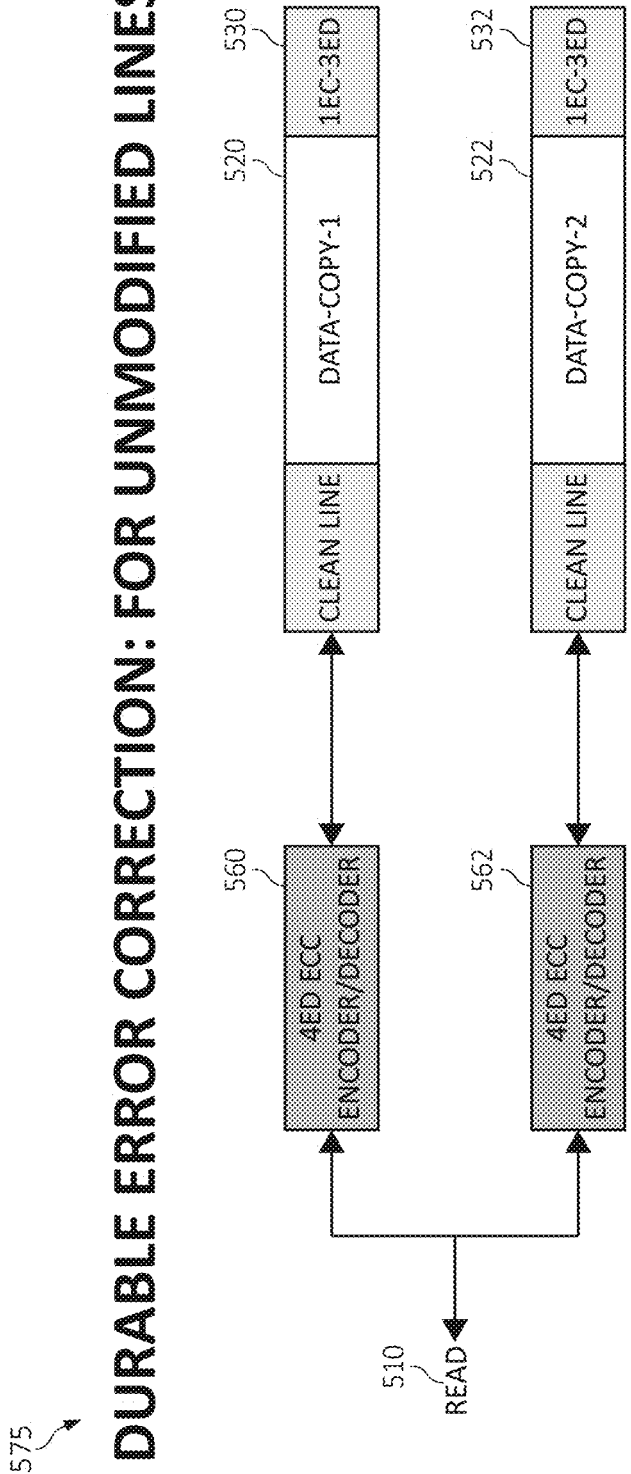
Figure 5I:
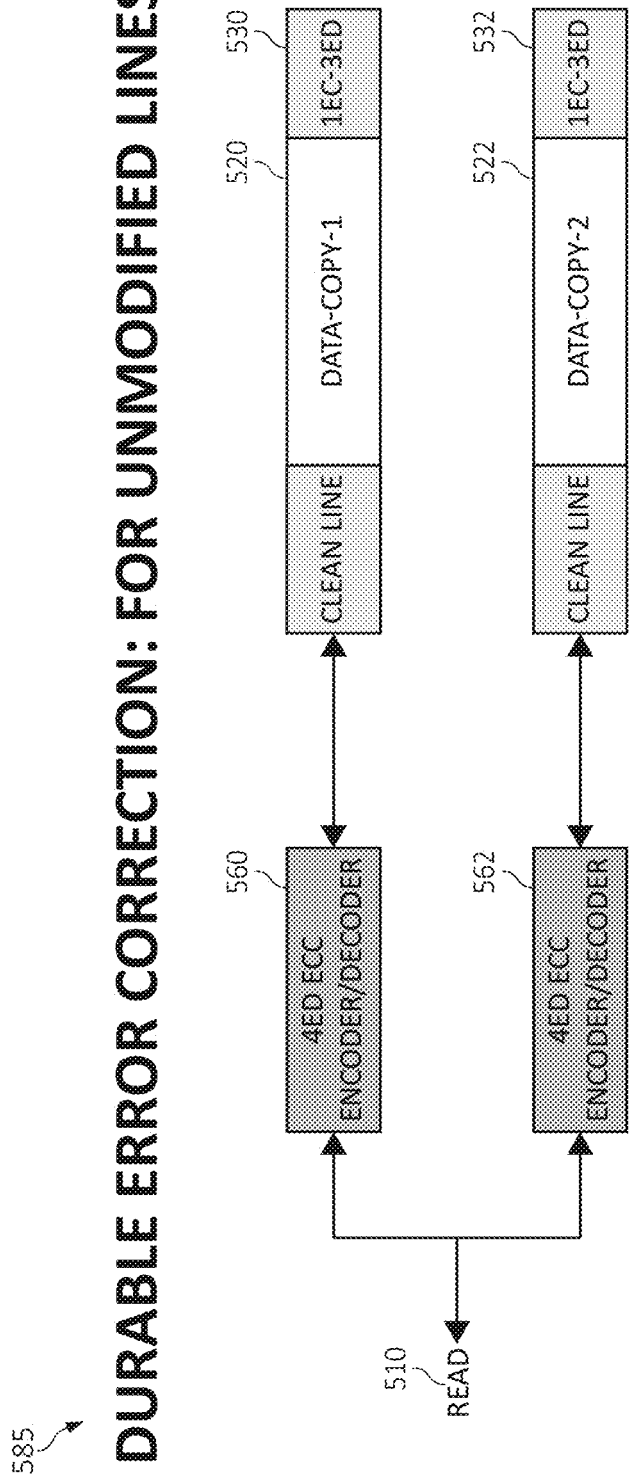

Turning now to FIGS. 5G-5I for durable error correction for unmodified lines using SEC code and TED code in a multiport banked memory array, in the event that there are unmodified lines (e.g., with clean lines) for data copy 520 and data copy 522, the encoder/decoder 540 and/or 542 may be used as a quadruple error detector ("4ED") ECC encoder/decoder such as, for example, 4ED ECC encoder/decoder 560 and 562 may be used to enhance/strengthen error code detection. For example, as in FIG. 5H, if the 4ED ECC encoder/decoder 560 and/or 562 detects an error in data copy 520 and/or data copy 522, the line from the other data copy may be read. For example, if the 4ED ECC encoder/decoder 560 detects an error in data copy 520 then the data copy 522 may be read if the data copy 522 is "clean." However, if data copy 522 includes a correctable error, the data copy 522, which is a clean copy, may still be used unless the original data from which data copy 522 is copied maps to a different value/word.

In the event that both 4ED ECC encoder/decoder 560 and/or 562 detect uncorrectable errors in both data copy 520 and/or data copy 522 and/or the data copy 520 and data copy 522 generate different results, the data copy 520 and/or data copy 522 may both be declared as uncorrectable. Also, one or more silent errors may be reduced.

In this way, the operations of FIGS. 5A-5I enables correction of all error detection scenarios up to three aggregate errors in any configuration across the two registers. In addition, some cases of four or more errors can be corrected using the same architecture, provided each register has a detectable number of failures and at least one register has a correctable number of failures.

More specifically, for any correction tool capable of correcting "C" errors and detecting 2C+1 errors, mechanisms of the illustrated embodiment such as, for example, those described in FIGS. 5A-5I allow total correction of 2C+1 errors, detection of 2C+2 errors and partial correction of many more. In one aspect, all data copy failures one less than a hamming distance of a code (by definition of hamming distance) may be detected and corrected using the other data copy. For example, using a hamming distance of 5 (e.g., triple detect, single correct) at least four ("4") errors may be detected.

Furthermore, the present invention may operate as a quadruple error detector ("4ED") ECC code. Such error detection codes may be used for clean data in the caches. If a clean data error is detected, the line in a cache may be invalided and refilled from the next level of the cache.

In one aspect, one or more conditions (e.g., two conditions) that are determined to be uncorrectable are: 1) both data (e.g., words) map to a value that detect multiple errors but no correction, and 2) both data (e.g., words) map to correctable data (e.g., words) which are different. If either data copy maps to a "correct" state, then the data value may be used because it is desirable to retain full performance if there are no errors on any read operation. To produce silent errors, one of 2 conditions must occur. First, the data (e.g., words) has sufficient bit errors to map to a completely clean other data word (i.e., the full hamming distance) and second, the data copies map to a state that correct to the same faulty data (e.g., words).

Figure 6:
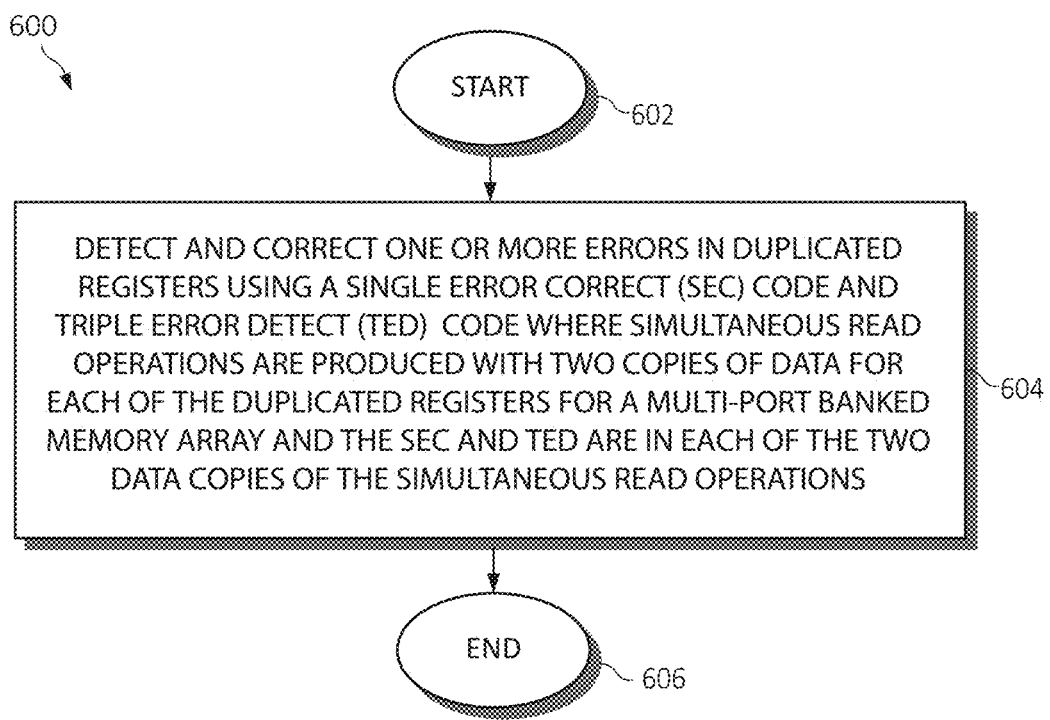
FIG. 6 is a flowchart diagram depicting an exemplary method for providing enhanced error correction using SEC code and TED code to optimize bandwidth and resilience under multiple bit failures in a computing system in which aspects of the present invention may be realized.

Turning now to FIG. 6, a flowchart diagram depicts an exemplary method 600 for providing enhanced error correction using single error correction ("SEC") code and triple error detection ("TED") code to optimize bandwidth and resilience under multiple bit failures in a computing system. The functionality 600 may be implemented as a method executed as instructions on a machine, where the instructions are included on at least one computer readable medium or on a non-transitory machine-readable storage medium. The functionality 600 may start in block 602.

One or more errors may be detected and corrected in duplicated registers using an SEC code and TED code where simultaneous read operations are produced with two copies of data for each of the duplicated registers for a multi-port banked memory array and the SEC code and TED code may be included in each of the two data copies of the simultaneous read operations, as in block 604. The functionality 600 may end in block 606.

In one aspect, in conjunction with and/or as part of at least one block of FIG. 6, the operation of method 600 may include each of the following. The operation of functionality 600 may read the data from a selected port in the multi-port banked memory array upon the SEC code and TED code failing to detect an error in the data and correct the one or more errors in the data from one or both of the two copies of the data.

The operation of functionality 600 may read the data from a second one of the two copies in a selected port in the multi-port banked memory array upon the SEC code and TED code detecting one or more errors in the data from a first one of the two copies; and correct the one or more errors in the data from the first one of the two copies.

The operation of functionality 600 may use the data from a second one of the two copies of the data having corrected data from previously detected and corrected errors upon determining one or more errors in the data from a first one of the two copies and/or use the data from a first one of the two copies of the data having corrected data from previously detected and corrected errors upon determining one or more errors in the data from a second one of the two copies of the data. The operation of functionality 600 may indicate one or more errors in the data from both of the two copies of data are uncorrectable upon each of the two copies producing different, corrected data.

Figure 7:
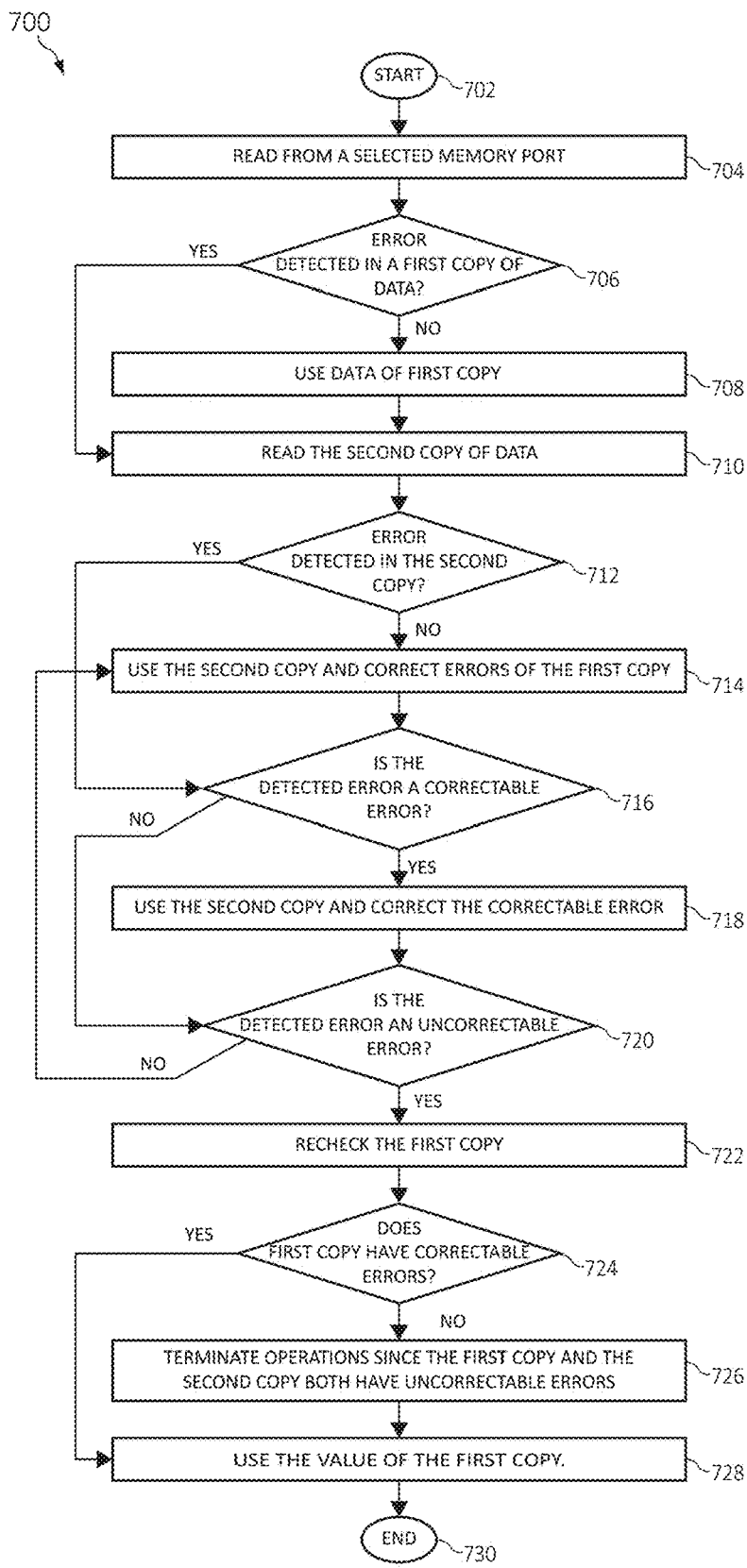
FIG. 7 is an additional flowchart diagram depicting an exemplary method for providing enhanced error correction using SEC code and TED code to optimize bandwidth and resilience under multiple bit failures in a computing system in which aspects of the present invention may be realized.

Turning now to FIG. 7, method 700 provides enhanced error correction using SEC code and TED code to optimize bandwidth and resilience under multiple bit failures in a computing system. The functionality 700 may be implemented as a method executed as instructions on a machine, where the instructions are included on at least one computer readable medium or on a non-transitory machine-readable storage medium. The functionality 700 may start in block 702.

A read operation may be performed to read data (e.g., a first or second copy of the data) from a selected memory port, as in block 704. A determination operation is performed to determine if there is an error detected in a first copy of the data, as in block 706. If there is no error detected, the data of the first copy of the data may be used for the read operation, as in block 708. If an error is detected in the first copy of the data, the method 700 may move to block 710 and the second copy of the data may be read.

A determination operation is performed to determine if there is an error detected in a second copy of the data, as in block 712. If there is no error detected in the second copy of the data, as in block 712, the method 700 may move to block 714 where the read operation may use the second copy of the data and update/correct the error of the first copy of the data. If there is an error detected in the second copy of the data, as in block 712, the method 700 may move to block 716, where a determination operation is performed to determine if the error detected in the second copy of the data is a correctable error, as in block 716.

If the detected error in the second copy of the data is a correctable error, the second copy of data may be used and the correctable error may be corrected, as in block 718. If the detected error in the second copy of the data is not a correctable error, the method 700 may move to block 720, where a determination operation is performed to determine if the detected error is an uncorrectable error detected in the second copy of the data, as in block 720.

If the detected error in the second copy of the data is not an uncorrectable error (as in block 720), the method 700 may return to block 714. At this point, the method 700 end if necessary if returned to block 714.

If the detected error in the second copy of the data is an uncorrectable error (as in block 720), the first copy of data may be rechecked, as in block 722, and determine if the error in the first copy of data is a correctable error, as in block 724.

If the error in the first copy of data is a correctable error, as in block 724, the data of the first copy (e.g., the value of the first copy of the data) may be used, as in block 728. However, if the error in the first copy of data is uncorrectable error (as in block 724), the read operation may be terminated since the errors in the first copy and the second copy of the data both have uncorrectable errors, as in block 722. The functionality 700 may end in block 730.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The invention claimed is:

1. A method, by a processor, for providing enhanced error correction using a single error correction (SEC) code and triple error detection (TED) code in a computing system, comprising:
   receiving a request to read data respectively stored in duplicated registers of a multi-port banked memory array, wherein two copies of the data are maintained for each of the duplicated registers of the multi-port banked memory array,
   responsive to receiving the request to read the data stored in the duplicated registers, determining that one or more correctable errors exist in a first copy or a second copy of the two copies of the data; and
   correcting the one or more correctable errors in at least one of the first copy and the second copy of the two copies of the data stored in the duplicated registers using an SEC code and TED code encoded in each of the two copies of the data stored in the duplicated registers, wherein the SEC code and TED code are each utilized to correct up to three aggregate correctable errors irrespective of which of the first copy and the second copy stored in the duplicated registers the data having the up to three aggregate correctable errors exists.

2. The method of claim 1, further including reading the data from a selected port in the multi-port banked memory array upon the SEC code and TED code failing to detect an error in the data.

3. The method of claim 1, further including:
reading the data from the second copy of the data in a selected port in the multi-port banked memory array upon the SEC code and TED code detecting the one or more correctable errors exist within the first copy of the data; and
correcting the one or more correctable errors in the the first copy of the data.

4. The method of claim 1, further including, responsive to detecting the one or more correctable errors exist in the first copy of the data, satisfying the request to read the data using the second copy of the data, wherein the second copy of the data is inclusive of corrected data generated from previously detected and corrected errors.

5. The method of claim 1, further including indicating the one or more correctable errors in the first copy of the data and the second copy of the data are uncorrectable upon each of the two copies of the data producing different, corrected data.

6. A system for providing enhanced error correction using single error correction (SEC code) and triple error detection (TED code) in a computing system, comprising:
one or more computers with executable instructions that when executed cause the system to:
receive a request to read data respectively stored in duplicated registers of a multi-port banked memory array, wherein two copies of the data are maintained for each of the duplicated registers of the multi-port banked memory array;
responsive to receiving the request to read the data stored in the duplicated registers, determine that one or more correctable errors exist in a first copy or a second copy of the two copies of the data; and
correct the one or more correctable errors in at least one of the first copy and the second copy of the two copies of the data stored in the duplicated registers using an SEC code and TED code encoded in each of the two copies of the data stored in the duplicated registers, wherein the SEC code and TED code are each utilized to correct up to three aggregate correctable errors irrespective of which of the first copy and the second copy stored in the duplicated registers the data having the up to three aggregate correctable errors exists.

7. The system of claim 6, wherein the executable instructions read the data from a selected port in the multi-port banked memory array upon the SEC code and TED code failing to detect an error in the data.

8. The system of claim 6, wherein the executable instructions:
read the data from the second copy of the data in a selected port in the multi-port banked memory array upon the SEC code and TED code detecting the one or more correctable errors exist within the first copy of the data; and
correct the one or more correctable errors in the the first copy of the data.

9. The system of claim 6, wherein the executable instructions, responsive to detecting the one or more correctable errors exist in the first copy of the data, satisfy the request to read the data use the second copy of the data, wherein the second copy of the data is inclusive of corrected data generated from previously detected and corrected errors.

10. The system of claim 6, wherein the executable instructions indicate the one or more correctable errors in the first copy of the data and the second copy of the data are uncorrectable upon each of the two copies of the data producing different, corrected data.

11. A computer program product for providing enhanced error correction using single error correction (SEC code) and triple error detection (TED code) in a computing system by a processor, the computer program product comprising a non-transitory computer-readable storage medium having computer-readable program code portions stored therein, the computer-readable program code portions comprising:
an executable portion that receives a request to read data respectively stored in duplicated registers of a multi-port banked memory array, wherein two copies of the data are maintained for each of the duplicated registers of the multi-port banked memory array;
an executable portion that, responsive to receiving the request to read the data stored in the duplicated registers, determines that one or more correctable errors exist in a first copy or a second copy of the two copies of the data; and
an executable portion that corrects the one or more correctable errors in at least one of the first copy and the second copy of the two copies of the data stored in the duplicated registers using an SEC code and TED code encoded in each of the two copies of the data stored in the duplicated registers, wherein the SEC code and TED code are each utilized to correct up to three aggregate correctable errors irrespective of which of the first copy and the second copy stored in the duplicated registers the data having the up to three aggregate correctable errors exists.

12. The computer program product of claim 11, further including an executable portion that reads the data from a selected port in the multi-port banked memory array upon the SEC code and TED code failing to detect an error in the data.

13. The computer program product of claim 11, further including an executable portion that:
reads the data from the second copy of the data in a selected port in the multi-port banked memory array upon the SEC code and TED code detecting the one or more correctable errors exist within the first copy of the data; and
corrects the one or more correctable errors in the the first copy of the data.

14. The computer program product of claim 11, further including an executable portion that,
responsive to detecting the one or more correctable errors exist in the first copy of the data, satisfies the request to read the data uses the second copy of the data, wherein the second copy of the data is inclusive of corrected data generated from previously detected and corrected errors.

15. The computer program product of claim 11, further including an executable portion that indicates the one or more correctable errors in the first copy of the data and the second copy of the data are uncorrectable upon each of the two copies of the data producing different, corrected data.

* * * * *